United States Patent
Wang

(10) Patent No.: US 9,330,626 B2
(45) Date of Patent: May 3, 2016

(54) DRIVING CIRCUIT AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventor: Jieqiong Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 33 days.

(21) Appl. No.: 14/105,468

(22) Filed: Dec. 13, 2013

(65) Prior Publication Data

US 2014/0168046 A1  Jun. 19, 2014

(30) Foreign Application Priority Data

Dec. 14, 2012 (CN) .......................... 2012 1 0546131

(51) Int. Cl.
*G09G 3/36* (2006.01)
*H03K 6/02* (2006.01)

(52) U.S. Cl.
CPC ............ *G09G 3/3696* (2013.01); *G09G 3/3688* (2013.01); *H03K 6/02* (2013.01); *G09G 2310/0248* (2013.01); *G09G 2310/0291* (2013.01); *G09G 2320/0252* (2013.01)

(58) Field of Classification Search
CPC ............ G09G 2320/00; G09G 3/3696; G09G 3/3688; G09G 2320/0252; G09G 2310/0291; H03K 6/02; H02M 3/156; H02M 2001/0025; G05F 1/571; G05F 1/573; G05F 1/575
See application file for complete search history.

(56) References Cited

U.S. PATENT DOCUMENTS 5,627,460 A * 5/1997 Bazinet ................... G05F 1/618
323/224
5,867,136 A * 2/1999 Zimlich ............... G09G 3/2011
345/690

(Continued)

FOREIGN PATENT DOCUMENTS

CN            1890706 A       1/2007
CN           102110418 A      6/2011
WO         2005057545 A1      6/2005

OTHER PUBLICATIONS

First Chinese Office Action dated Dec. 3, 2014; Appln. No. 201210546131.0.

(Continued)

*Primary Examiner* — Priyank Shah
(74) *Attorney, Agent, or Firm* — Ladas & Parry LLP

(57) ABSTRACT

Provided are a driving circuit and a display panel, the driving circuit comprises a voltage dividing module, a comparing module and a switching module, wherein the voltage dividing module has a first terminal connected to a first terminal of the switching module, a second terminal connected to a first terminal of the comparing module, and a third terminal serving as a grounding terminal; a second terminal of the comparing module is connected to a first voltage input terminal, third, fourth and fifth terminals of the comparing module are connected to three control terminals of the switching module respectively; the first terminal of the switching module is connected to a voltage output terminal, a second terminal of the switching module is connected to the first voltage input terminal, and third and fourth terminals of the switching module are connected to second and third voltage input terminal, respectively.

7 Claims, 4 Drawing Sheets

(56) References Cited

U.S. PATENT DOCUMENTS

| | | | | |
|---|---|---|---|---|
| 6,411,269 B1* | 6/2002 | Zimlich | ............... | G09G 3/2011 315/169.1 |
| 7,973,518 B2* | 7/2011 | Shor | ....................... | G05F 1/563 323/224 |
| 8,248,046 B2* | 8/2012 | Hasegawa | ............. | H02M 3/158 323/271 |
| 8,988,054 B2* | 3/2015 | Marty | ................... | H02M 3/158 323/273 |
| 2007/0279024 A1* | 12/2007 | Falvey et al. | ................. | 323/280 |
| 2011/0157246 A1 | 6/2011 | Jang | | |
| 2013/0049716 A1* | 2/2013 | Saeki | ........................... | 323/271 |

OTHER PUBLICATIONS

Extended European Search Report issued Aug. 1, 2014; Appln. No. EP 12 19 7077.
Second Chinese Office Action Appln. No. 201310546131.0; Dated Apr. 1, 2015.
EPO Communication Appln. No. 13 197 077.4-1904; Dated Jun. 25, 2015.

* cited by examiner

DRIVING CIRCUIT AND DISPLAY PANEL

TECHNICAL FIELD

The present disclosure relates to the field of electronics technique, particularly to a driving circuit and a display panel.

BACKGROUND

Currently, high-speed large-size Thin Film Transistor-Liquid Crystal Display TFT-LCD products have high requirements on driving voltages for pixel units. In the prior art, the driving voltages are supplied directly from data lines to individual pixel units in the TFT-LCD; however, in the TFT-LCD products, since the pixel units have resistive-capacitive loads, and the driving voltages received by the pixel units during an initial period in which the TFT-LCD products are powered on are often lower than voltages output from the data lines, that is, a leading portion of the driving voltages for the pixel units is missing. Especially in large-size LCD products, the voltages along the data line direction will decrease from top to bottom, which results in inaccuracy in grayscale displayed by the pixel units and in turn poor image quality.

SUMMARY

In embodiments of the present disclosure, there are provided a driving circuit and a display panel for alleviating the issue of the missing in the leading portion of the driving voltage for the pixel unit.

According to an embodiment of the present disclosure, there is provided a driving circuit comprising a voltage dividing module, a comparing module and a switching module, wherein a first terminal of the voltage dividing module is connected to a first terminal of the switching module, a second terminal of the voltage dividing module is connected to a first terminal of the comparing module, and a third terminal of the voltage dividing module serves as a grounding terminal; the voltage dividing module receives an output voltage of the switching module, and outputs a feedback voltage to the comparing module after dividing the output voltage;

a second terminal of the comparing module is connected to a first voltage input terminal, third, fourth and fifth terminals of the comparing module are connected to three control terminals of the switching module respectively; the comparing module outputs control signals to the switching module according to the comparison of the feedback voltage and a first voltage input from the first voltage input terminal so that the switching module outputs a voltage equal to the first voltage when the feedback voltage is equal to the first voltage, wherein the first voltage is a target driving voltage;

a first terminal of the switching module is connected to a voltage output terminal, a second terminal of the switching module is connected to the first voltage input terminal, a third terminal of the switching module is connected to a second voltage input terminal, and a fourth terminal of the switching module is connected to a third voltage input terminal; the switching module controls its own state according to the control signals output from the comparing module so as to output a voltage to the voltage output terminal.

According to another embodiment of the present disclosure, there is further provided a driving circuit comprising a voltage dividing module, a comparing module, a switching module and a voltage stabilizing module; wherein a first terminal of the voltage dividing module is connected to a first terminal of the voltage stabilizing module, a second terminal of the voltage dividing module is connected to a first terminal of the comparing module, and a third terminal of the voltage dividing module serves as a grounding terminal; the voltage dividing module receives an output voltage of the voltage stabilizing module, and outputs a feedback voltage to the comparing module after dividing the output voltage;

a second terminal of the comparing module is connected to a first voltage input terminal, third, fourth and fifth terminals of the comparing module are connected to three control terminals of the switching module respectively; the comparing module outputs control signals to the switching module according to the comparison of the feedback voltage and a first voltage input from the first voltage input terminal so that the switching module outputs a voltage equal to the first voltage when the feedback voltage is equal to the first voltage, wherein the first voltage is a target driving voltage;

a first terminal of the switching module is connected to a second terminal of the voltage stabilizing module, a second terminal of the switching module is connected to the first voltage input terminal, a third terminal of the switching module is connected to a second voltage input terminal, and a fourth terminal of the switching module is connected to a third voltage input terminal; the switching module controls its own state according to the control signals output from the comparing module so as to output a voltage to the voltage stabilizing module; and the first terminal of the voltage stabilizing module is connected to a voltage output terminal; the voltage stabilizing module stabilizes the output voltage of the switching module and outputs a stabilized voltage to the voltage output terminal.

According to another embodiment of the present disclosure, there is further provided a display panel comprising the above driving circuit.

In the driving circuit provided in the embodiments of the present disclosure, after the circuit is powered on, the output voltage of the switching module is controlled to equal to a target driving voltage only when the feedback voltage is equal to the target driving voltage; since the feedback voltage is a voltage divided from the output voltage of the circuit, that is, the feedback voltage is less than the output voltage of the circuit, the feedback voltage is controlled to equal to the target driving voltage during the initial period in which the circuit is powered on, so that the output voltage of the circuit is higher than the target driving voltage. That is, the missing in the leading portion of the driving voltage for pixel unit is compensated by means of overdriving.

BRIEF DESCRIPTION OF THE DRAWINGS

The accompanying drawings are provided to aid a further understanding of the present disclosure, and constitute a part of the specification, for illustrating the present disclosure together with the embodiments of the present disclosure, and not for making any limitation on the present disclosure.

DETAILED DESCRIPTION OF THE PREFERRED EMBODIMENTS

In order to provide an implementation for compensating the missing in the leading portion of the driving voltage for the pixel unit, a driving circuit and a display panel are provided in embodiments of the present disclosure. Hereinafter, the preferable embodiments of the present disclosure are described with reference to the accompanying drawings. It should be appreciated that the preferable embodiments of the present disclosure are only for illustrating the present disclosure, and are not intended to limit the scope of the present disclosure in any way. Further, throughout the specification, the technical features in an embodiment can be combined with the technical features in another embodiment without conflicting with each other.

First Embodiment

Figure 1:
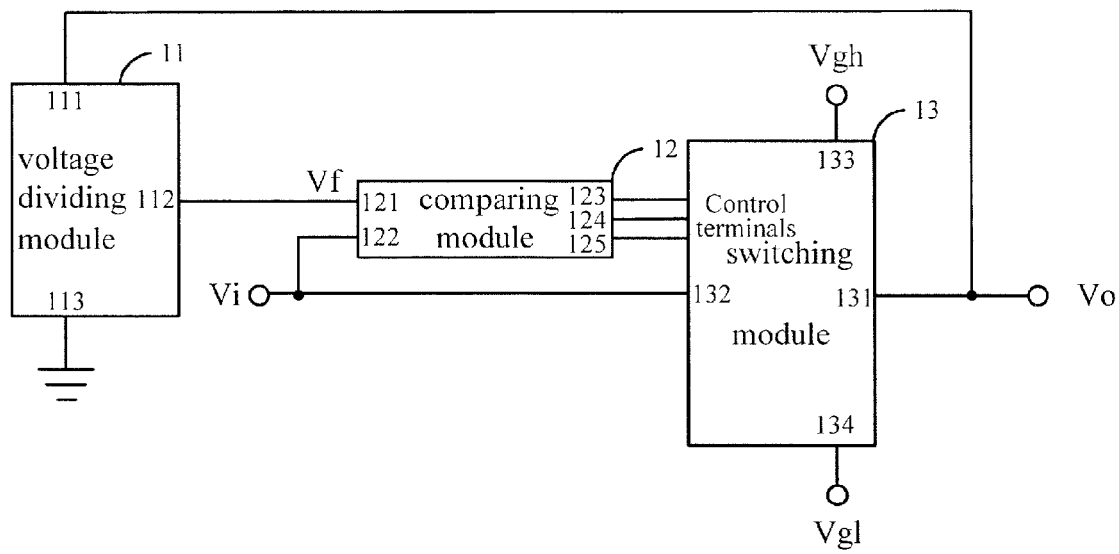
FIG. 1 is a structure diagram illustrating a driving circuit provided in a first embodiment of the present disclosure.

In the first embodiment of the present disclosure, there is provided a driving circuit connected between a data line and a TFT-LCD, and as shown in FIG. 1, the driving circuit comprises a voltage dividing module 11, a comparing module 12 and a switching module 13.

The voltage dividing module 11 has a first terminal 111 connected to a first terminal 131 of the switching module 13, a second terminal 112 connected to a first terminal 121 of the comparing module 12, and a third terminal 131 as a grounding terminal. A second terminal 122 of the comparing module 12 is connected to a first voltage input terminal, and third, fourth and fifth terminals 123, 124 and 125 of the comparing module 12 are connected to three control terminals of the switching module 13 respectively. The first terminal 131 of the switching module 13 is connected to a voltage output terminal, a second terminal 132 of the switching module 13 is connected to the first voltage input terminal, a third terminal 133 of the switching module 13 is connected to a second voltage input terminal, and a fourth terminal 134 of the switching module 13 is connected to a third voltage input terminal.

The voltage dividing module 11 receives an output voltage Vo of the switching module 13, and outputs a feedback voltage Vf to the comparing module 12 after dividing the output voltage Vo; the comparing module 12 outputs control signals to the switching module 13 according to the comparison of the feedback voltage Vf and a first voltage Vi input from the first voltage input terminal, so that the switching module 13 outputs a voltage Vo equal to the first voltage Vi when the feedback voltage Vf is equal to the first voltage Vi, wherein the first voltage Vi is a target driving voltage; the switching module 13 controls its own state according to the control signals output from the comparing module 12 so as to output a voltage to the voltage output terminal.

Figure 2:
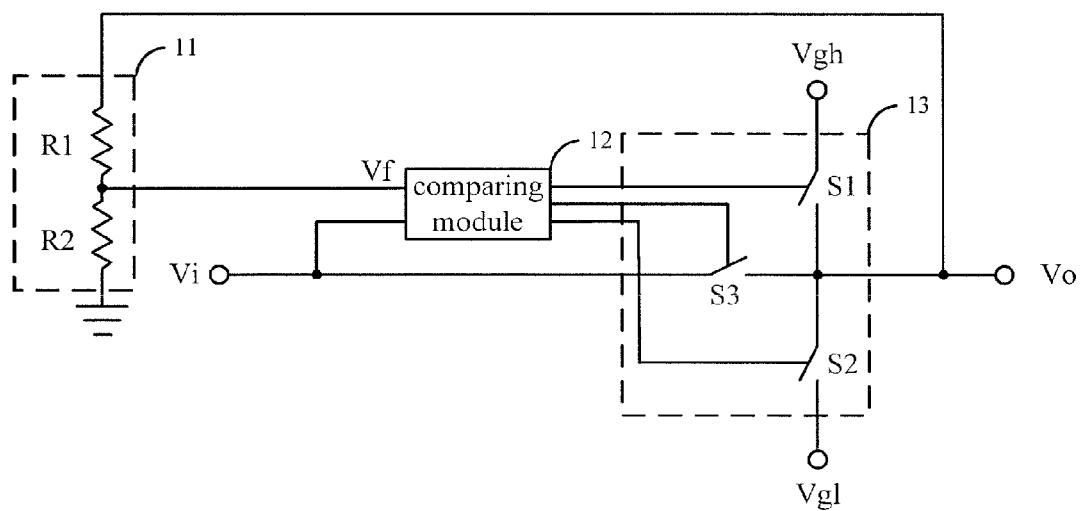
FIG. 2 is a detailed structure diagram illustrating the driving circuit provided in the first embodiment of the present disclosure.

The detailed structure of the driving circuit provided in the first embodiment of the present disclosure is illustrated in FIG. 2.

In particular, the voltage dividing module 11 can comprise a structure formed by a first resistor R1 and a second resistor R2 connected in series, two terminals of the structure serve the first terminal 111 and the third terminal 113 of the voltage dividing module 11 respectively, and the point where the first resistor R1 and the second resistor R2 are connected serves as the second terminal 112 of the voltage dividing module 11.

In particular, the switching module 13 can comprise a first switch S1, a second switch S2, and a third switch S3, wherein:

a first terminal of the first switch S1, a first terminal of the second switch S2, and a first terminal of the third switch S3 serve as the three control terminals of the switching module 13; a second terminal of the first switch S1, a second terminal of the second switch S2 and a second terminal of the third switch S3 are connected together for severing as the first terminal 131 of the switching module 13; a third terminal of the third switch S3 severs as the second terminal 132 of the switching module 13; a third terminal of the first switch S1 severs as the third terminal 133 of the switching module 13; and a third terminal of the second switch S2 severs as the fourth terminal 134 of the switching module 13.

The comparing module 12 can be of any controllable logic circuit, and the structure thereof is not described in detail herein. When a second voltage Vgh input from the second voltage input terminal is greater than the first voltage Vi and the first voltage Vi is greater than a third voltage Vgl input from the third voltage input terminal, the logic control flow for generating the control signals is as follows.

When the feedback voltage Vf is lower than the first voltage Vi, the comparing module 12 outputs control signals to close the first switch S1 and to open the second switch S2 and the third switch S3; when the feedback voltage Vf is greater than the first voltage Vi, the comparing module 12 outputs control signals to close the second switch S2 and to open the first switch S1 and the third switch S3; when the feedback voltage Vf is equal to the first voltage Vi, the comparing module 12 outputs control signals to close the third switch S3 and to open the first switch S1 and the second switch S2.

When the driving circuit is powered on, the comparing module 12 receives the feedback voltage Vf output from the voltage dividing module 11 and the first voltage Vi, and outputs control signals according to the logic control flow described above; the switching module 13 closes or opens the individual switches according to the control signals so as to adjust the feedback voltage Vf to make it equal to the first voltage Vi; during the phase, the switching module 13 closes the first switch S1 and opens the second switch S2 and the third switch S3, and a voltage Vo output from the driving circuit is higher than the first voltage Vi; when the feedback voltage Vf is equal to the first voltage Vi, the comparing module 12 outputs control signals to the switching module 13 so that the latter closes the third switch S3 and opens the first switch S1 and the second switch S2, and at this time, the voltage Vo output from the driving circuit is equal to the first voltage Vi.

It can be seen that in the driving circuit provided in the present embodiment of the present disclosure, the missing in the leading portion of the driving voltage for the pixel unit is compensated by means of the overdriving principle. Nevertheless, in practice, there may be a case in which the output voltage of the switching module might be unstable. Preferably, a voltage stabilizing module can be arranged after the switching module to improve the performance of the driving circuit.

Second Embodiment

Figure 3:
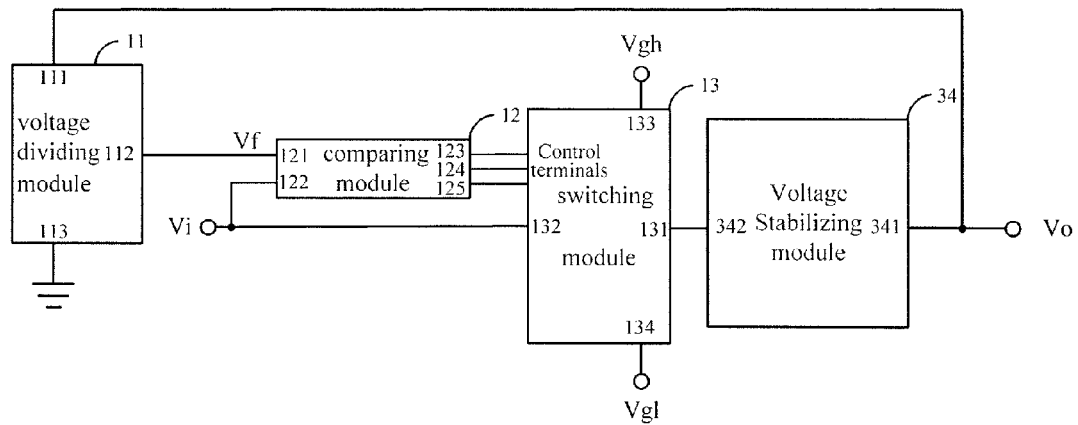
FIG. 3 is a structure diagram illustrating a driving circuit provided in a second embodiment of the present disclosure.

In the second embodiment of the present disclosure, there is provided a driving circuit connected between a data line and a TFT-LCD, and as shown in FIG. 3, the driving circuit comprises a voltage dividing module 11, a comparing module 12, a switching module 13 and a voltage stabilizing module 34.

The voltage dividing module 11 has a first terminal 111 connected to a first terminal 341 of the voltage stabilizing module 34, a second terminal 112 connected to a first terminal 121 of the comparing module 12, and a third terminal 113 as a grounding terminal. A second terminal 122 of the comparing module 12 is connected to a first voltage input terminal, and third, fourth and fifth terminals 123, 124 and 125 of the comparing module 12 are connected to three control terminals of the switching module 13 respectively. A first terminal 131 of the switching module 13 is connected to a second terminal 342 of the voltage stabilizing module 34, a second terminal 132 of the switching module 13 is connected to the first voltage input terminal, a third terminal 133 of the switching module 13 is connected to a second voltage input terminal, and a fourth terminal 134 of the switching module 13 is connected to a third voltage input terminal. The first terminal 341 of the voltage stabilizing module 34 is connected to a voltage output terminal.

The voltage dividing module 11 receives an output voltage Vo of the voltage stabilizing module 34, and outputs a feedback voltage Vf to the comparing module 12 after dividing the output voltage Vo; the comparing module 12 outputs control signals to the switching module 13 according to the comparison of the feedback voltage Vf and a first voltage Vi input from the first voltage input terminal, so that the switching module 13 outputs a voltage Vo equal to the first voltage Vi when the feedback voltage Vf is equal to the first voltage Vi, wherein the first voltage Vi is a target driving voltage; the switching module 13 controls its own state according to the control signals output from the comparing module 12 so as to output a voltage to the voltage stabilizing module 34; the voltage stabilizing module 34 stabilizes the output voltage of the switching module 13 and outputs a stabilized voltage to the voltage output terminal.

Figure 4:
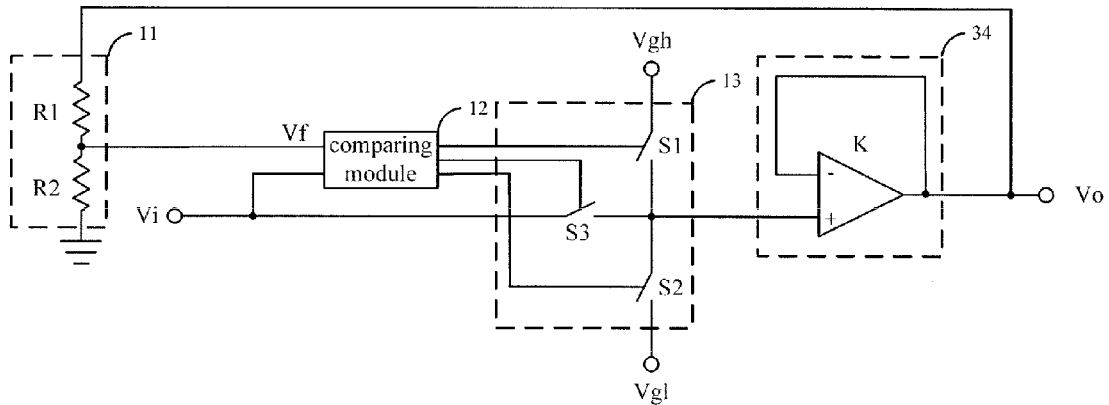
FIG. 4 is a detailed structure diagram illustrating the driving circuit provided in the second embodiment of the present disclosure.

The detailed structure of the driving circuit provided in the second embodiment of the present disclosure is illustrated in FIG. 4.

In particular, the voltage dividing module 11 can comprise a structure formed by a first resistor R1 and a second resistor R2 connected in series, two terminals of the structure serve the first terminal 111 and the third terminal 113 of the voltage dividing module 11 respectively, the point where the first resistor R1 and the second resistor R2 are connected serves as the second terminal 112 of the voltage dividing module 11.

In particular, the switching module 13 can comprise a first switch S1, a second switch S2, and a third switch S3, wherein: a first terminal of the first switch S1, a first terminal of the second switch S2, and a first terminal of the third switch S3 serve as the three control terminals of the switching module 13; a second terminal of the first switch S1, a second terminal of the second switch S2 and a second terminal of the third switch S3 are connected together for severing as the first terminal 131 of the switching module 13; a third terminal of the third switch S3 severs as the second terminal 132 of the switching module 13; a third terminal of the first switch S1 severs as the third terminal 133 of the switching module 13; a third terminal of the second switch S2 severs as the fourth terminal 134 of the switching module 13.

Specifically, the voltage stabilizing module 34 can be an operational amplifier K, wherein an output terminal of the operational amplifier K severs as the first terminal 341 of the voltage stabilizing module 34, a non-inverting input terminal of the operational amplifier K severs as the second terminal 342 of the voltage stabilizing module 34, and an inverting input terminal of the operational amplifier K is connected to the output terminal of the operational amplifier K.

The comparing module 12 can be of any controllable logic circuit, and the structure thereof is not described in detail herein. When a second voltage Vgh input from the second voltage input terminal is greater than the first voltage Vi and the first voltage Vi is greater than a third voltage Vgl input from the third voltage input terminal, the logic control flow for generating the control signals is as follows.

When the feedback voltage Vf is lower than the first voltage Vi, the comparing module 12 outputs control signals to close the first switch S1 and to open the second switch S2 and the third switch S3; when the feedback voltage Vf is greater than the first voltage Vi, the comparing module 12 outputs control signals to close the second switch S2 and to open the first switch S1 and the third switch S3; when the feedback voltage Vf is equal to the first voltage Vi, the comparing module 12 outputs control signals to close the third switch S3 and to open the first switch S1 and the second switch S2.

In the driving circuit provided in the second embodiment of the present disclosure, a voltage stabilizing module is added on the basis of the driving circuit provided in the first embodiment of the present disclosure, and the operating principle of the driving circuit provided in the second embodiment of the present disclosure is similar to that in the first embodiment of the present disclosure, and the details are omitted.

Figure 5:
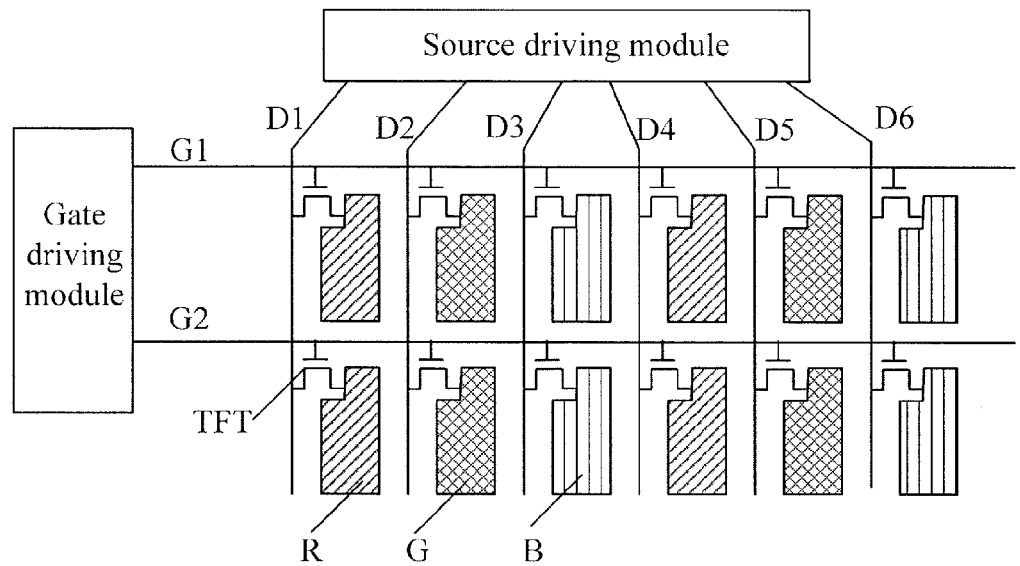
FIG. 5 is a structure diagram illustrating a LCD apparatus provided in an embodiment of the present disclosure.

In practice, the driving circuit provided in first embodiment or in the second embodiment of the present disclosure can be used in a LCD apparatus comprising a gate driving circuit, a source driving circuit and a display panel, as shown in FIG. 5. The display panel includes gate lines and data lines crossing each other, and individual pixel units formed at the intersections of the gate lines and the data lines. One TFT is arranged in each pixel unit. Particularly, the gate driving circuit is connected with a plurality of gate lines, for supplying the gate lines with the voltages for turning on the gates of the transistors and the voltages for turning off the gates of the transistors, and for controlling the TFTs in the pixel units to be turned on or turned off. Particularly, the source driving circuit is connected with a plurality of data lines, for supplying each pixel unit with a data signal. As the voltage is transmitted from top to bottom, the voltage along the data line direction will decrease from top to bottom due to the resistive-capacitive load of the pixel unit.

In the LCD apparatus utilizing the driving circuit provided in the embodiments of the present disclosure, the first voltage input terminal can be connected to an output terminal for a data signal of the source driving circuit, that is, the uppermost end of the data line (a case in which the data signal is transmitted from top to bottom is taken as example); the second voltage input terminal can receive the voltage for turning on the gate of the transistor, and the third voltage input terminal can receive the voltage for turning off the gate of the transistor. The voltage output terminal is connected to the data line where the pixel unit locates. Thus, the voltage of each pixel unit in realtime can be fed back to the comparing module 12 via the feedback voltage Vf output from a feedback terminal; and the feedback voltage Vf is compared to the first voltage Vi in realtime, and the comparing module 12 outputs control signals to the switching module 13 according to the comparison of the feedback voltage Vf and the first voltage Vi.

When the feedback voltage Vf is less than the first voltage Vi, it is indicated that it is necessary to increase the output voltage of the voltage output terminal, so as to drive the pixel unit much better. At this time, the comparing module outputs control signals to close the first switch S1 and to open the second switch S2 and the third switch S3. At this time, the first switch S1 can provide a higher voltage Vgh, so that the output voltage Vo of the voltage output terminal increases, and thus the pixel unit is driven much better; when the feedback voltage Vf is greater than the first voltage Vi, it is indicated that it is necessary to decrease the output voltage Vo of the voltage output terminal, so as to drive the pixel unit much better. At this time, the comparing module outputs control signals to close the second switch S2 and open the first switch S1 and the third switch S3. At this time, the second switch S2 can provide a lower voltage Vgl, so that the output voltage Vo of the voltage output terminal decreases, and thus the pixel unit is driven much better; when the feedback voltage Vf is equal to the first voltage Vi, the comparing module outputs control signals to close the third switch S3 and to open the first switch S1 and the second switch S2. Since the third switch S3 is connected to the first voltage Vi, the pixel unit can be driven much better without processing the output voltage Vo.

Figure 6:
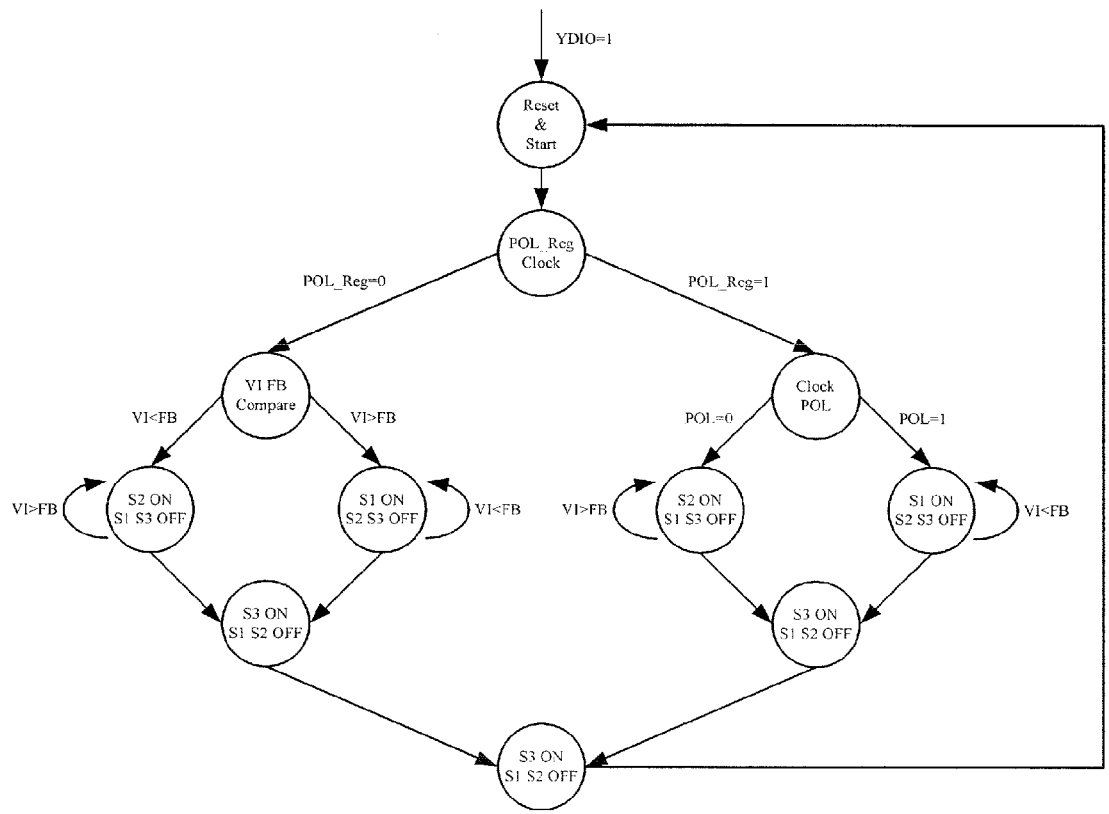
FIG. 6 is a schematic diagram showing a logic control flow for generating control signals provided in an embodiment of the present disclosure.

When generating the control signals for switches, a frame start signal YDIO and a polarity control signal Pol can also be considered, and at this time, the control flow for the switches is shown in FIG. 6.

It can be seen that, in the embodiments of the present disclosure, the driving circuit compensates the data lines of the TFT-LCD by means of the overdriving principle so as to increase the initial voltage to complement the missing in the leading portion of the voltage, thus improving the image quality. The driving circuit controls the output timing of individual voltages by the comparing module, and the length of time of individual voltages depends on when the feedback voltage Vf is adjusted to equal to the first voltage Vi; the length of time of individual voltages is adjusted, so that, when a same driving voltage is applied, the column of pixels render a grayscale which is consistent with that in other regions, thus improving the image quality.

In an embodiment of the present disclosure, an amplification factor is adjusted according to the serial number of a gate line and the polarity of the voltage (POL_reg represents the polarity), so as to complement the missing in the leading portion of the voltage, thereby improving the image quality.

Figure 7:
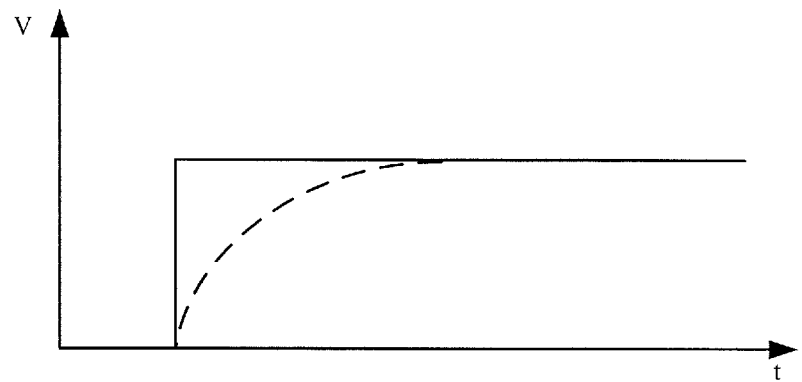
FIG. 7 is a schematic diagram showing a driving voltage for a pixel unit in the prior art.
Figure 8:
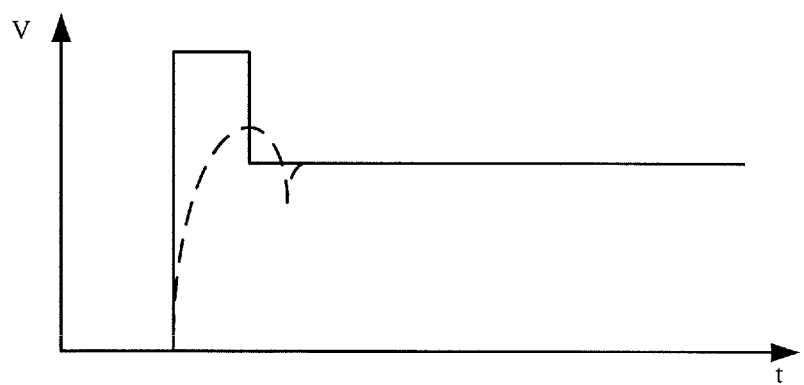
FIG. 8 is a schematic diagram showing a driving voltage for a pixel unit provided in an embodiment of the present disclosure.

In the prior art, an output voltage of a data line is shown in the solid line in FIG. 7, and a driving voltage for a pixel unit is shown in the dashed line in FIG. 7; when the driving circuit provided in the second embodiment the present disclosure is utilized, the output voltage of the driving circuit is shown in the solid line in FIG. 8, and the driving voltage for the pixel unit is shown in the dashed line in FIG. 8. It can be seen that when the driving circuit provided in the second embodiment of the present disclosure is utilized, the missing in the leading portion of the driving voltage for the pixel unit can be compensated.

According to another embodiment of the present disclosure, there is further provided a display panel comprising the above driving circuit.

Further, the display panel is a TFT-LCD display panel.

In Summary, the driving circuit provided in the embodiments of the present disclosure comprises a voltage dividing module, a comparing module and a switching module, wherein the voltage dividing module has a first terminal connected to a first terminal of the switching module, a second terminal connected to a first terminal of the comparing module, and a third terminal as a grounding terminal; the voltage dividing module receives an output voltage of the switching module, and outputs a feedback voltage to the comparing module after dividing the output voltage; a second terminal of the comparing module is connected to the first voltage input terminal, third, fourth and fifth terminals of the comparing module are connected to three control terminals of the switching module respectively; the comparing module outputs control signals to the switching module according to the comparison of the feedback voltage and a first voltage so that the switching module outputs a voltage equal to the first voltage when the feedback voltage is equal to the first voltage, wherein the first voltage is a target driving voltage; the first terminal of the switching module is connected to a voltage output terminal, a second terminal of the switching module is connected to the first voltage input terminal, a third terminal of the switching module is connected to the second voltage input terminal, and a fourth terminal of the switching module is connected to the third voltage input terminal; the switching module controls its own state according to the control signals output from the comparing module so as to output a voltage to the voltage output terminal. The missing in the leading portion of the driving voltage for the pixel unit can be compensated by use of the driving circuit provided in the embodiments of the present disclosure.

Obviously, those skilled in the art can make various modifications and variations on the embodiments of the present disclosure without departing from the spirit and scope of the invention. Thus, provided that these modifications and variations belong to the scope of the claims and their equivalences, the present disclosure is also intended to include these modifications and variations.

What is claimed is:

1. A driving circuit comprising a voltage dividing module, a comparing module and a switching module, wherein
   a first terminal of the voltage dividing module is connected to a first terminal of the switching module, a second terminal of the voltage dividing module is connected to a first terminal of the comparing module, and a third terminal of the voltage dividing module serves as a grounding terminal; the voltage dividing module receives an output voltage of the switching module, and outputs a feedback voltage to the comparing module after dividing the output voltage;
   a second terminal of the comparing module is connected to a first voltage input terminal, third, fourth and fifth terminals of the comparing module are connected to three control terminals of the switching module respectively; the comparing module outputs control signals to the switching module according to a comparison of the feedback voltage and a first voltage input from the first voltage input terminal;
   the first terminal of the switching module is connected to a voltage output terminal, a second terminal of the switching module is connected to the first voltage input terminal, a third terminal of the switching module is connected to a second voltage input terminal, and a fourth terminal of the switching module is connected to a third voltage input terminal; the switching module controls its own state according to the control signals output from the comparing module so as to output a voltage to the voltage output terminal,
   wherein the second voltage of the second voltage input terminal is higher than the first voltage of the first voltage input terminal, and the first voltage of the first voltage input terminal is higher than the third voltage of the third voltage input terminal,
   the switching module outputs the second voltage to the voltage output terminal when the feedback voltage is lower than the first voltage, and outputs the first voltage to the voltage output terminal when the feedback voltage is equal to the first voltage, wherein the first voltage is a target driving voltage.

2. The driving circuit of claim 1, wherein the voltage dividing module comprises a structure formed by a first resistor and a second resistor connected in series, two terminals of the structure serve the first terminal and the third terminal of the voltage dividing module respectively, and a point where the first resistor and the second resistor are connected serves as the second terminal of the voltage dividing module.

3. The driving circuit of claim 1, wherein the switching module comprises a first switch, a second switch, and a third switch, wherein:
- a first terminal of the first switch, a first terminal of the second switch, and a first terminal of the third switch serve as the three control terminals of the switching module;
- a second terminal of the first switch, a second terminal of the second switch and a second terminal of the third switch are connected together for severing as the first terminal of the switching module;
- a third terminal of the third switch severs as the second terminal of the switching module;
- a third terminal of the first switch severs as the third terminal of the switching module; and
- a third terminal of the second switch severs as the fourth terminal of the switching module.

4. A display panel comprising a driving circuit, wherein the driving circuit comprises a voltage dividing module, a comparing module and a switching module, wherein
- a first terminal of the voltage dividing module is connected to a voltage output terminal, a second terminal of the voltage dividing module is connected to a first terminal of the comparing module, and a third terminal of the voltage dividing module serves as a grounding terminal; the voltage dividing module receives an output voltage of the switching module, and outputs a feedback voltage to the comparing module after dividing the output voltage;
- a second terminal of the comparing module is connected to a first voltage input terminal, third, fourth and fifth terminals of the comparing module are connected to three control terminals of the switching module respectively; the comparing module outputs control signals to the switching module according to a comparison of the feedback voltage and a first voltage input from the first voltage input terminal; and
- a first terminal of the switching module is connected to a voltage output terminal, a second terminal of the switching module is connected to the first voltage input terminal, a third terminal of the switching module is connected to a second voltage input terminal, and a fourth terminal of the switching module is connected to a third voltage input terminal; the switching module controls its own state according to the control signals output from the comparing module so as to output a voltage to the voltage output terminal,
- wherein the second voltage of the second voltage input terminal is higher than the first voltage of the first voltage input terminal, and the first voltage of the first voltage input terminal is higher than the third voltage of the third voltage input terminal,
- the switching module outputs the second voltage to the voltage output terminal when the feedback voltage is lower than the first voltage, and outputs the first voltage to the voltage output terminal when the feedback voltage is equal to the first voltage, wherein the first voltage is a target driving voltage.

5. The display panel of claim 4, wherein the display panel is a Thin Film Transistor Liquid Crystal Display panel.

6. The display panel of claim 4, wherein the voltage dividing module comprises a structure formed by a first resistor and a second resistor connected in series, two terminals of the structure serve the first terminal and the third terminal of the voltage dividing module respectively, and a point where the first resistor and the second resistor are connected serves as the second terminal of the voltage dividing module.

7. The display panel of claim 4, wherein the switching module comprises a first switch, a second switch, and a third switch, wherein:
- a first terminal of the first switch, a first terminal of the second switch, and a first terminal of the third switch serve as the three control terminals of the switching module;
- a second terminal of the first switch, a second terminal of the second switch and a second terminal of the third switch are connected together for severing as the first terminal of the switching module;
- a third terminal of the third switch severs as the second terminal of the switching module;
- a third terminal of the first switch severs as the third terminal of the switching module; and
- a third terminal of the second switch severs as the fourth terminal of the switching module.

* * * * *